United States Patent [19]

Miyatake et al.

[11] Patent Number: 4,712,123
[45] Date of Patent: Dec. 8, 1987

[54] DYNAMIC MEMORY DEVICE

[75] Inventors: Hideshi Miyatake; Kazuyasu Fujishima, both of Itami; Tsutomu Yoshihara, Amagasaki; Masaki Kumanoya; Hideto Hidaka, both of Itami; Katsumi Dosaka, Nishinomiya, all of Japan

[73] Assignee: Mitsubishi Denki Kabushiki Kaisha, Tokyo, Japan

[21] Appl. No.: 771,023

[22] Filed: Aug. 30, 1985

[30] Foreign Application Priority Data

Aug. 31, 1984 [JP] Japan ................................. 59-183074

[51] Int. Cl.$^4$ ............................................. H01L 29/78
[52] U.S. Cl. ...................................... 357/23.6; 357/41
[58] Field of Search ................................. 357/23.6, 41

[56] References Cited

U.S. PATENT DOCUMENTS 424,002  12/1980  Kuo .

OTHER PUBLICATIONS

1980 IEEE International Solid-State Circuits Conference, Session XVII: Random Access Memories—Fam 17.6 A 5V-Only 64K Ram.
IEEE Transactions on Electron Devices, vol. ED-27, No. 8, Aug. 1980, Single 5-V, 64K Ram with Scaled-Down MOS Structure.

Primary Examiner—Martin H. Edlow
Attorney, Agent, or Firm—Birch, Stewart, Kolasch, & Birch

[57] ABSTRACT

A dynamic memory device including 1-transistor, 1-capacitor type dynamic memory cell, wherein a half voltage of the writing voltage is applied to a cell plate, and a constant voltage is applied to the substrate.

3 Claims, 9 Drawing Figures

DYNAMIC MEMORY DEVICE

FIELD OF THE INVENTION

The present invention relates to a dynamic memory device, and more particularly, to an improvement in the voltages of the memory cell plate and of the substrate of a dynamic MOS RAM.

BACKGROUND OF THE INVENTION

Conventionally, 1-transistor, 1-capacitor (hereinafter referred to as "1Tr-1C") type cells are widely used for dynamic MOS RAMs. FIG. 1 shows a cross-sectional view of a typical example of a 1Tr-1C type cell. In the Figure, the reference numeral 1 designates a bit line electrode, the numeral 2 designates a word line electrode, the numeral 3 designates a cell plate electrode, the numeral 4 designates a diffusion layer, the numerals 5 and 6 designate oxide films, the numeral 7 designates a storage node, and the numeral 8 designates a substrate. The elements 1, 2, 4, and 5 constitute a MOS transistor, and the elements 3, 6, and 7 constitute a MOS capacitor.

The cell plate electrode 3 is usually connected to the ground level or a power supply voltage. In the 1Tr-1C type cells carriers are stored at the inverted layer of the storage node 7, and the equivalent circuit thereof is shown in FIG. 2. In FIG. 2, the numeral 9 designates a MOS capacitance, and the numeral 10 designates a junction capacitance between the inverted layer and the substrate 8. The junction capacitance 10 is usually about 20% of the MOS capacitance 9.

With the increase of the capacity of dynamic RAMs, the cell area decreases and the MOS capacitance 9 and the junction capacitance 10 also decrease. Against this problem, there is an attempt to use a thin film as the oxide film below the cell plate in order to secure the storage capacitance. However, the breakdown voltage decreases with the decrease of the film thickness, thereby lowering the reliability. As a countermeasure against this problem, there is a measure to make the voltage of the cell plate 3 a half value of the voltage to be written into the storage node 7. This lowers the voltage applied to the gate oxide film 6 to a half value, thereby improving the breakdown voltage to a great extent.

There are two types of circuits, for example, a resistor (11, 12) dividing circuit shown in FIG. 3 and a MOS transistor (13) dividing circuit shown in FIG. 4 which realize the half voltage value of the writing voltage in a dynamic RAM having a single power supply voltage of 5 V. However, the output resistances will necessarily become high caused by the restrictions in stand-by currents of the dynamic RAMs or the restrictions in transistor sizes in both cases of using the circuits of FIGS. 3 and 4.

In dynamic RAMs where the substrate voltage is generated inside a chip as mainly used recently, when the cell plate exhibits an electrically high resistance against the ground level or the power supply voltage, it is likely to lose the storage charge in the memory cell.

The above-described disadvantage is described in greater detail, in the following:

Usually the substrate voltage is generated by a charge-pump circuit shown in FIG. 5. In FIG. 5, the numeral 14 designates a MOS transistor, the numeral 15 designates a capacitor, the numeral 16 designates an oscillator, and $V_{BB}$ designates a substrate voltage. The operation of the charge-pump circuit is well known, and the description thereof is abbreviated for simplicity. The voltage $V_{BB}$ generated by this circuit is electrically floating with respect to the voltages generated by external power supplies, and it is likely to be subjected to variations by such as capacitance coupling.

In the operation of a dynamic RAM charging and discharging are repeated, and when the junction capacitances associated with a lot of transistors are charged or discharged at once, the substrate voltage varies caused by the capacitance couplings of the junction capacitances.

FIG. 6 shows typical waveforms of signals including the substrate voltage in an operation of a dynamic RAM. In the Figure, WL designates a word line signal, SE designates a sense signal, and $V_{BB}$ designates a substrate voltage.

After the external $\overline{RAS}$ signal falls, the word line WL rises, and the information of the memory cell is transmitted to the bit line. Thereafter, the sense signal SE rises, and the bit line is sensed. Then, all the bit lines are sensed at once in usual dynamic RAMs, and charges at the large junction capacitance associated with all the bit lines are discharged, and by this capacitor coupling the substrate voltage $V_{BB}$ varies in the direction of a negative voltage. When the external $\overline{RAS}$ signal rises thereafter, the word line WL falls. Thereafter, all the bit lines are pre-charged. Then, the substrate voltage varies in the opposite direction, that is, the direction of positive voltage.

FIG. 7 shows potential levels for electrons in the memory cell portion of the dynamic RAM. SN shows potential levels for the storage node, WL shows those for the word line, and BL shows those for the bit line.

The operation before variation is described as follows:

L shows a potential level when a low level is written in, and electrons are filled up to that level. H shows a potential level when a high level is written in, and electrons are filled up to that level. The difference between the "L" and "H" states corresponds to the difference of the quantity of storage charges. The "ON" state of WL means that the word line is opened, whereby it is possible for the potential level to fall to the high level "H" to be written into the storage node. The "OFF" state of WL means that the word line is closed, whereby the storage node and the bit line are cut off from each other.

Now suppose that the bit line BL is sensed, a low or high level signal is stored in the storage node, and the word line WL is closed. Then, the substrate voltage varies in the direction of positive voltage, and the voltage at the storage node varies to the positive voltage side to the extent obtained by dividing the variation of the substrate voltage by the junction capacitance 10 and the MOS capacitance 9 shown in FIG. 2. In this state, both potentials of the low and high levels fall as shown in FIG. 7 as after variation. When the word line rises in the next cycle, the potential of the word line falls only up to the high level "H" before variation, whereby the quantity of charges read out after variation decreases as shown by hatching in FIG. 7. The extent of this decrease is as great as the variation of the substrate voltage. The variation of the substrate voltage depends on the junction capacitance which gives rise to a capacitance coupling, and on the stray capacitance between the substrate and ground level and between the substrate and the power supply level. That is, as the stray capacitance is great, the variation of the substrate voltage becomes small. The stray capacitance of the substrate itself is the sum of the junction capacitances of the diffusion layers of the ground line and of the power supply line, the capacitance between the substrate and ground through the junction capacitance of the bit lines, the capacitance between the substrate and ground through the junction capacitance of the storage node, and the MOS capacitance. In large capacity memories, the proportion of the capacitance between the substrate and ground through the junction capacitance of the storage node and the MOS capacitance among the capacitances amounts to a large value of about 50%.

As shown in the memory cell equivalent circuit of FIG. 2, the capacitance per memory cell between the substrate and the ground through the junction storage node is equal to a serial sum of the junction capacitance 10 and the MOS capacitance 9. The junction capacitance 10 is about 20% of the MOS capacitance 9, and the capacitance between the substrate and ground becomes approximately equal to the junction capacitance 10.

However, when a half voltage of the writing voltage is applied to the cell plate, the cell plate exhibits an electrically high-resistance against ground as already described. In that case, the MOS capacitance 9 against ground becomes small effectively, whereby the MOS capacitance 9 can not be ignored. As result, the capacitance per a memory cell between the substrate and ground through the storage node decreases to well below the junction capacitance 10.

Thus, the stray capacitance of the substrate itself decreases, and the variation of the substrate voltage due to the charging and discharging of the bit line becomes large. The variation will amount to 2 or 3 times the substrate voltage.

As described above, there is a disadvantage that the operational margin of the dynamic RAM decreases due to the loss of the quantity of the storage charges when a half voltage of the writing voltage is applied to the cell plate in a semiconductor memory device including a substrate voltage generating circuit.

Another prior art dynamic memory device is described in U.S. Pat. No. 4,240,292 entitled "RANDOM ACCESS MEMORY CELL WITH DIFFERENT CAPACITOR AND TRANSISTOR OXIDE THICKNESS". In this patent, it is disclosed that it is possible to increase the storage capacitance with the use of a thin oxide film by decreasing the cell plate voltage (for example, up to about ½ of the writing voltage), and thereby decreasing the electric field applied to the oxide film.

Another prior art dynamic memory cell is disclosed in an article "Single 5 V, 64K RAM with Scaled-Down MOS Structure" HIROO MASUDA et al. IEEE TRANS. ELECTRON DEVICES. vol. ED-27, No.-8, pp. 1607-1612, Aug., 1980. In this article, it is disclosed that in a dynamic RAM including a substrate voltage generating circuit the S/N ratio is lowered due to the variation of the substrate voltage which is caused by the capacitance coupling of the junctions constituting the bit lines and the decoders which occurs during the charging and discharging of the bit line and the decoder.

Yet another prior art dynamic RAM is disclosed in an article "A 5 V-only 64K Dynamic RAM" Lionel S. White et al., ISSCC Dig. Tech. Papers, pp. 230 to 231, Feb., 1980. In this article it is disclosed that it is possible to suppress the variation of the substrate voltage by making the substrate voltage the ground level.

SUMMARY OF THE INVENTION

The present invention is directed to solving the problems pointed out above, and has for its object to provide a dynamic RAM capable of enhancing the breakdown voltage of the gate oxide film without a loss of the quantity of storage electric charges even when a half voltage of the writing voltage is applied to the cell plate.

Other objects and advantages of the present invention will become apparent from the detailed description given hereinafter; it should be understood, however, that the detailed description and specific embodiments are given by way of illustration only, since various changes and modifications within the spirit and scope of the invention will become apparent to those skilled in the art from this detailed description.

According to the present invention, there is provided a dynamic memory device including 1-transistor, 1-capacitor type dynamic memory cells, wherein a half value of the writing voltage is applied to a cell plate, and a constant voltage is applied to the substrate.

DETAILED DESCRIPTION OF THE PREFERRED EMBODIMENTS

Figure 8:
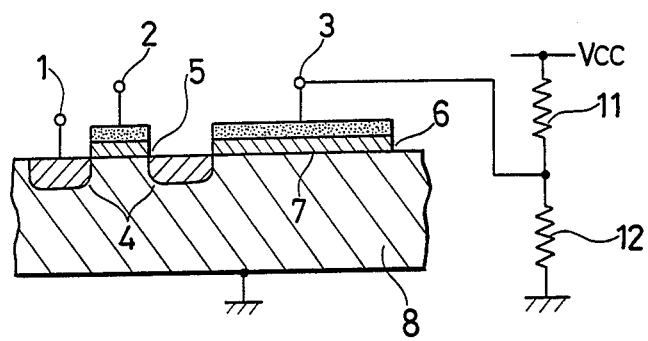
FIG. 8 is a cross-sectional view of a 1Tr-IC type cell as one embodiment of the present invention when a half value of the writing voltage is applied to the cell plate and the substrate voltage is made equal to the ground level.

In order to explain the present invention in detail, reference will be particularly made to FIG. 8.

Figure 1:
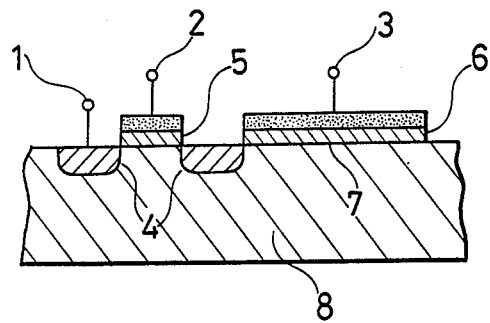
FIG. 1 is a cross-sectional view showing a prior art 1Tr-IC type cell.
Figure 2:
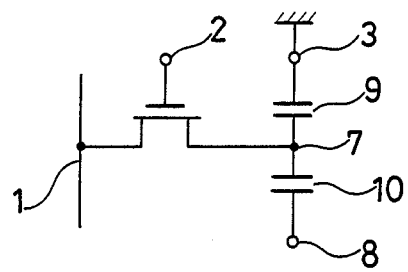
FIG. 2 is a diagram showing an equivalent circuit of the memory cell section when the cell plate voltage is made equal to the ground level.
Figure 3:
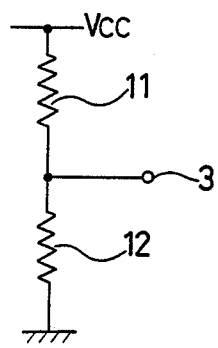
FIG. 3 and FIG. 4 are circuit diagrams showing a voltage source generating circuit for generating a half voltage of the writing voltage.
Figure 4:
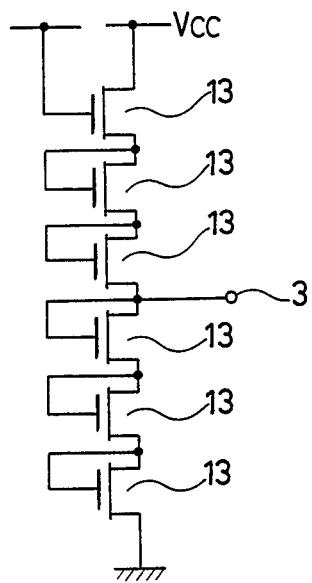
Figure 5:
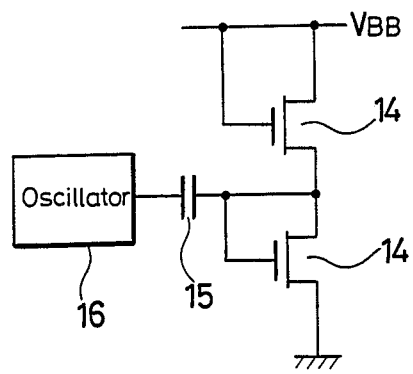
FIG. 5 is a diagram showing a conventional charge pump circuit.
Figure 6:
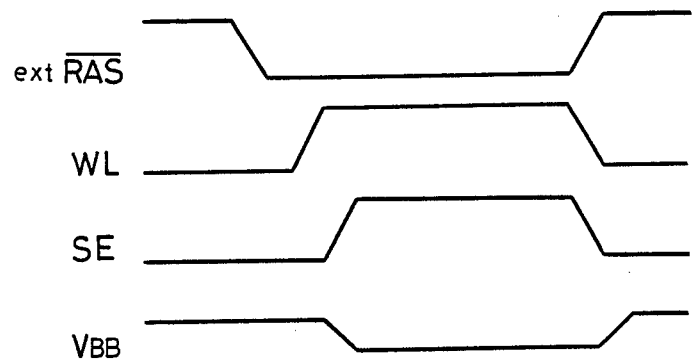
FIG. 6 is a diagram showing waveforms for exemplifying the variation of the substrate voltage.
Figure 7:
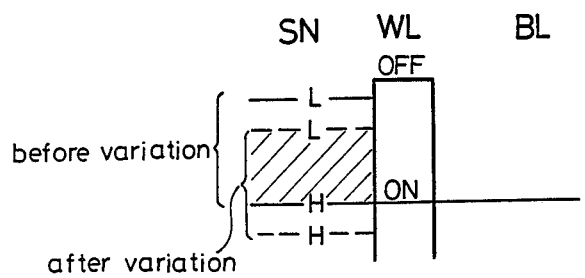
FIG. 7 is a diagram showing potential levels for electrons for exemplifying the loss of storage charges when a variation has occured in the substrate voltage.

In FIG. 8 the same reference numerals designate the same element as those in FIGS. 2 and 3. A half value of the writing voltage is applied to the cell plate by the resistors 11 and 12, and the substrate voltage 8 is fixed to the ground level.

In this embodiment the substrate is fixed to the ground level, thereby generating no variation in the substrate voltage. Accordingly, a loss may not occur in the quantity of storage charges, and the voltage of the cell plate is held at a half value of the writing voltage, thereby realizing a dynamic RAM with an increased breakdown voltage of the oxide film.

Figure 9:
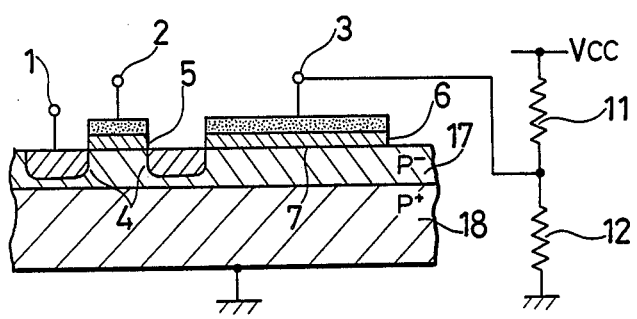
FIG. 9 is a cross-sectional view of 1Tr-IC type cell in a case where a cell is produced on an epitaxial growth substrate.

In a usual dynamic RAM a reverse bias voltage for the diffusion layer is applied to the substrate so as to prevent the injection of electrons into the memory cells from the peripheral circuit caused by a negative spike voltage, or a negative input voltage. When the substrate is fixed to the ground level, it is likely to incur an injection of electrons. However, the problem caused by the injection of electrons is resolved by using a material having a lot of recombination centers for the substrate itself, for example, p+ layer 18, and producing an element region at the surface thereof by growing p− layer 17 such as epitaxial growth layer as shown in FIG. 9. In such a structure, such electrons are transmitted in the deep portion of the substrate.

In the illustrated embodiment of FIG. 8, the substrate is fixed to the ground level, but if it is not restricted to a case where a 5 V single power supply is used, the substrate voltage can be fixed to an external voltage with the same effect.

As evident from the foregoing description, according to the present invention, the substrate is held at a stable voltage, thereby generating no loss of the quantity of storage charges due to the variation of the substrate voltage even when the voltage of the cell plate is made a half value of the writing voltage. This enables the increase of the breakdown voltage of the gate oxide film, and also the realization of a dynamic RAM having a high reliability and a large operational margin.

What is claimed is:

1. A dynamic MOS memory device including a plurality of memory cells of the 1-transistor, 1-capacitor type, each memory cell comprising:
   a semiconductor substrate;
   an epitaxial active layer formed on said substrate;
   a plurality of diffusion layers formed in said epitaxial layer at an area corresponding to a MOS transistor;
   an oxide film formed over said epitaxial layer except at locations where said diffusion layers are formed;
   a word line electrode formed on said oxide film at said area corresponding to a MOS transistor; and
   a cell plate electrode formed on said oxide film at an area corresponding to a MOS capacitance,
   a half value of a writing voltage being applied to said cell plate electrode, and a constant voltage being applied to said substrate.

2. A dynamic MOS memory device as set forth in claim 5, wherein said constant voltage to be applied to the substrate is provided by an external voltage source.

3. A dynamic MOS memory device as set forth in claim 5, wherein said constant voltage to be applied to the substrate is the ground level.

* * * * *